(12) United States Patent
Moehlmann et al.

(10) Patent No.: US 10,826,505 B1
(45) Date of Patent: Nov. 3, 2020

(54) ALL DIGITAL PHASE LOCKED LOOP (ADPLL) WITH FREQUENCY LOCKED LOOP

(71) Applicant: NXP B.V., Eindhoven (NL)

(72) Inventors: Ulrich Moehlmann, Moisburg (DE); Andreas Johannes Köllmann, Rosengarten (DE); Christian Scherner, Hamburg (DE)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/449,711

(22) Filed: Jun. 24, 2019

(51) Int. Cl.
*H03L 7/099* (2006.01)
*G04F 10/00* (2006.01)
*H03L 7/093* (2006.01)

(52) U.S. Cl.
CPC .......... *H03L 7/0992* (2013.01); *G04F 10/005* (2013.01); *H03L 7/093* (2013.01)

(58) Field of Classification Search
CPC .................................................... H03L 7/0992
USPC ............................................................ 331/34
See application file for complete search history.

(56) References Cited

U.S. PATENT DOCUMENTS 7,279,988 B1   10/2007   Janesch et al.
7,898,343 B1 *  3/2011   Janesch .................. H03L 7/087
                                                         331/11

OTHER PUBLICATIONS

Ahmed, Mohamed A., et al., "A Fast Locking Digital Phase-Locked Loop Using Frequency Difference Stage," International Journal of Engineering and Technology IJET-IJENS, vol. 14, No. 4; Aug. 2014; pp. 75-80.

Huang, Dian et al., "A Fast-Locked All-Digital Phase-Locked Loop for Dynamic Frequency Scaling," downloaded on Jun. 20, 2019 from <<http://citeseerx.ist.psu.edu/viewdoc/download?doi=10.1.1.468.8039&rep=rep1&type=pdf>>, 6 pages.

Xu, Liangge et al., "An All-Digital PLL Frequency Synthesizer With an Improved Phase Digitization Approach and an Optimized Frequency Calibration Technique," IEEE Transactions on Circuits and Systems—I: Regular Papers, vol. 59, No. 11; Nov. 2012; pp. 2481-2494.

\* cited by examiner

*Primary Examiner* — Joseph Chang

(57) ABSTRACT

A hardware device includes a frequency lock loop (FLL) that includes a phase loop filter, and a phase lock loop (PLL) such as an all digital PLL (ADPLL) that includes a frequency loop filter. A controller provides a first control signal to the FLL and a second control signal to the PLL when the device operates the same. The device can also include a digital controlled oscillator (DCO) and part of one or more of the FLL and the PLL. The FLL and the PLL include first and second filters, respectively. The filters are coupled to the DCO. A time-to-digital converter (TDC) and a divider receive an input from the DCO. The controller forms a first loop with the first filter, the TDC, and the divider, and the controller forms a second loop with the second filter, the TDC, and the divider.

20 Claims, 5 Drawing Sheets

ALL DIGITAL PHASE LOCKED LOOP (ADPLL) WITH FREQUENCY LOCKED LOOP

FIELD OF THE DISCLOSURE

The present disclosure relates generally to a phase locked loop (PLL) and more particularly to all digital phase locked loops (ADPLLs).

BACKGROUND

A PLL is a device that generates an output signal having a phase related to a phase of a reference signal. An all digital PLL (ADPLL) is a PLL in which all or many of its components operate digitally. A conventional ADPLL adjusts and locks its output phase to a phase based on a change to a phase of the reference signal. A conventional ADPLL often accelerates its frequency locking process by enlarging its bandwidth which results in a large modulation of its oscillator over a wide frequency range. If the modulation of the oscillator includes the desired lock frequency, the ADPLL can phase lock to that frequency if the system is a first order system. Higher order systems will pull the system to the right frequency which may take quite a long time if the frequency offset is large.

Furthermore, there will be some frequency modulation of the output signal which may cause timing issues if the clock is applied to one or more digital signal processors (DSPs). However, frequency locking behavior of ADPLLs is selected at design time and some frequency locking operations cause significant adverse effects on a system. For example, the locking procedure can result in a system DSP getting clocked to an excessively high and incorrect frequency. In other situations, timing violations can occur in digital blocks of the DSP. Further, there is a risk of false locks when an ADPLL lock range is wide (e.g., the ratio between maximum and minimum oscillator frequencies is on the order of 2 or larger). During the ADPLL lock process, false locks occur when phase words wrap in a certain manner so that a stable phase-difference pattern emerges. False locks can result in the oscillator of the ADPLL producing a fluctuating output frequency or a fixed but incorrect output frequency.

BRIEF DESCRIPTION OF THE DRAWINGS

The present disclosure may be better understood, and its numerous features and advantages made apparent to those skilled in the art by referencing the accompanying drawings. The use of the same reference symbols in different drawings indicates similar or identical items.

DETAILED DESCRIPTION

Figure 1:
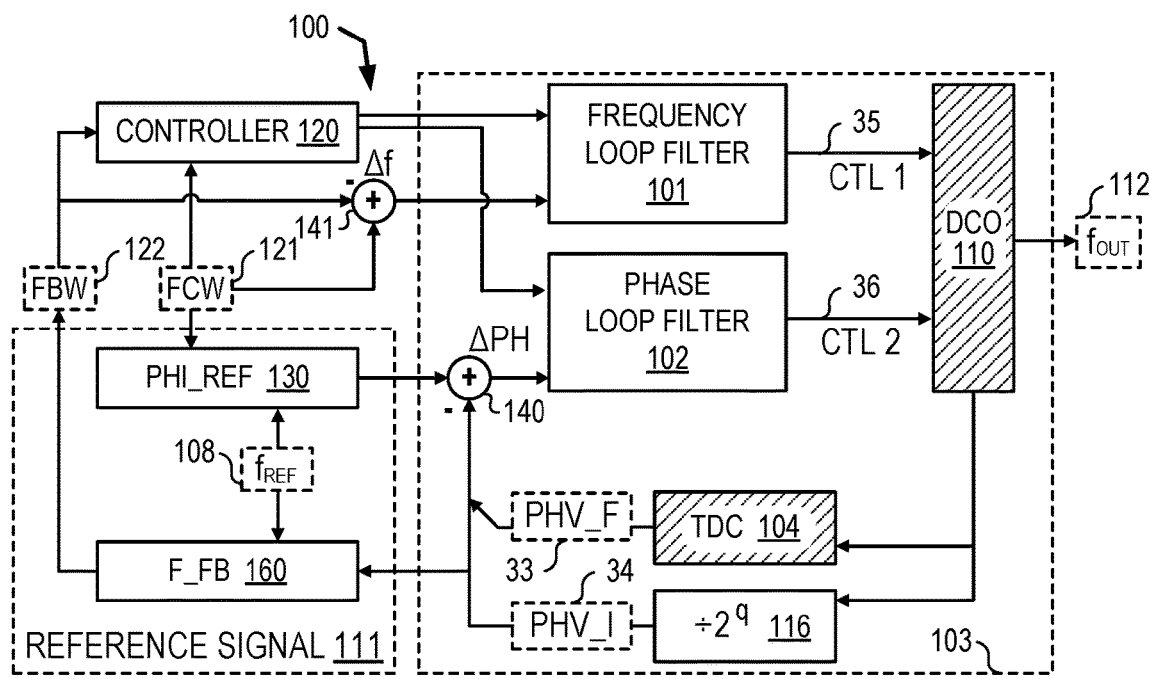
FIG. 1 is a block diagram of a device having an all digital phase locked loop (ADPLL) and a frequency locked loop (FLL) in accordance with some embodiments.

To avoid undesirable lock behaviors and to improve overall phase locking behavior in a hardware device, a frequency locked loop (FLL) is combined with an all digital phase locked loop (ADPLL). Examples of this type of hardware device include a frequency generator, a clock synthesizer, a wireless transceiver, and a frequency and phase tuning device. Generally, the FLL is a device or set of components which generates an output signal having a frequency that is a function of a reference frequency of a reference signal. In operation, an output frequency of the ADPLL may change occasionally or regularly depending on the application. For example, the output frequency of the ADPLL changes at device start-up and when changing to a new frequency which is a common activity of a device supporting a frequency-hopping protocol. Both FLLs and ADPLLs require a convergence period for the output frequency to stabilize at a new value.

FLLs in hardware devices often share components with other loops. For example, the FLL shares components with the ADPLL. Components, including those common to the FLL and the ADPLL, are first used to tune to a new frequency upon receiving a new reference signal during a first phase of operation. In a second phase of operation, the device tunes to a new phase with the ADPLL where at least some of its components are also common to the FLL. A device often remains in this second phase of operation until a subsequent new reference frequency or frequency control signal is provided to and detected by the device. The device then tunes to a different output frequency when the reference frequency or a multiplication factor in the form of a frequency control word (FCW) changes.

When combined with the ADPLL, the FLL provides increased sensitivity to frequency changes and faster locking times thereby reducing frequency overshoots that occur during the locking process relative to a conventional PLL. The FLL makes use of available information from components generally available in electronic devices and ADPLLs such as a feedback divider and a time-to-digital converter (TDC). Once a new frequency or frequency control setting is identified, based on the new reference signal or the frequency control setting and the output frequency locked thereto, a new phase is identified and the output phase is locked onto the reference phase of the reference signal.

According to certain embodiments of a device, frequency information is obtained from: (1) differentiating a signal from the divider/TDC to derive an oscillator frequency and (2) comparing this derived frequency with an input frequency. The oscillator target frequency can be provided digitally in the form of a frequency control word (FCW) as one implementation of a frequency multiplication factor between the reference frequency and an oscillator frequency. The FCW determines how many oscillator cycles should occur within one reference clock cycle. When the comparison is performed every reference clock cycle, the FCW is the target value of oscillator clock cycles expected for a locked FLL or PLL within that reference clock period. The device is able to lock to any frequency to which its oscillator can tune. A frequency loop gain determines how fast the new frequency is achieved. Based on the techniques and component combinations described herein, large frequency tuning jumps and frequency overshoots are avoided. Digital circuitry clocked by an ADPLL can be designed for a lower maximum operating frequency.

FIG. 1 is a block diagram of a device 100 having an ADPLL and an FLL in accordance with at least one embodiment. The device 100 receives a reference signal 111 having a frequency reference and a phase reference. Based on the reference signal 111, the device 100 produces an output signal 112. The output signal 112 includes an output frequency labeled "$f_{OUT}$" and an output phase. Upon receiving a new reference signal 111 having one or more of a new frequency reference and a new phase reference, the device 100 first tunes to, and locks to, a new output frequency $f_{OUT}$. Second, the device 100 tunes to, and locks to, a new output phase.

The device 100 includes a digitally controlled oscillator (DCO) 110, a controller 120, a reference phase generator 130 labeled PHI_REF, a feedback word generator 160 labeled F_FB, a frequency loop filter 101, and a phase loop filter 102. These devices are described in further detail below. The device 100 also includes a variety of other components including: a divider 116 labeled $\div 2^q$, a time-to-digital converter (TDC) 104, and adders 140, 141. The FLL includes various components including, for example, the frequency loop filter 101, the DCO 110, the TDC 104, and the controller 120. Certain components in the device 100 are analog and are illustrated with shading. Other components in the device 100 are digital and are illustrated without shading.

While not illustrated, a frequency divider as a post-divider can be provided between the DCO 110 and both the TDC 104 and the divider 116. The post-divider is not required for FLL or PLL loop operations. In some embodiments, the frequency divider is practical to generate the desired frequency indirectly by synthesizing a higher frequency and dividing the higher frequency down afterwards.

The controller 120 provides a frequency control signal to the frequency loop filter 101 that enables the frequency loop filter 101 to operate, and a phase control signal to the phase loop filter 102 that enables the phase loop filter 102 to operate in its turn. The loop filter 101 and the phase loop filter 102 are in a loop region 103 which includes many of the components that form the FLL and the ADPLL and at least some of these components are common to the FLL and the ADPLL. The frequency control signal is a first control signal from the controller 120 and the phase control signal is a second control signal from the controller 120. In some embodiments, the control signals from the controller 120 provide an enable signal to switch into a frequency locking mode and a phase locking mode, respectively. In other embodiments, the control signals from the controller 120 advantageously change one or more other settings such as a gain or a bandwidth setting.

In turn, the frequency loop filter 101 provides a first signal 35 labeled "CTL 1" to the DCO 110 and the phase loop filter 102 provides a second signal 36 labeled "CTL 2" to the DCO 110. Based on the first and second signals 35, 36, the DCO 110 generates the output signal 112 having the output frequency labeled $f_{OUT}$. The DCO 110 provides this same signal or a different signal to the TDC 104 and the divider 116. The TDC 104 receives the signal from the DCO 110 as input. This received signal may be considered a local oscillator (LO) signal. The TDC 104 produces a TDC output 33 labeled PHV_F. The divider 116 produces its output 34 labeled as PHV_I.

The combination of the signals from the TDC 104 and the divider 116 results in a negative input to a phase adder 140. The phase adder 140 sums a signal from the reference phase generator 130 and a negative value of a phase based on the TDC output 33 and the frequency divider output 34 to produce a phase difference signal labeled ΔPH which serves as an input to the phase loop filter 102. The combination of the signals from the TDC 104 and the divider 116 also is provided as input to the feedback word generator 160.

In addition to the reference signal 111, a reference frequency signal 108 labeled $f_{REF}$ is provided to the reference phase generator 130 and the feedback word generator 160 of the device 100. Based on the reference frequency signal 108 and the input from the DCO 110, the feedback word generator 160 produces a feedback word signal 122 which is provided to the controller 120 and a second adder 141. In the device 100, a frequency control word (FCW) signal 121 is provided to the controller 120, the reference phase generator 130, and the second adder 141. The second adder 141 produces a difference between the FBW signal 122 and the FCW signal 121, a frequency difference signal labeled Δf, and this difference serves as an input to the frequency loop filter 101.

In operation, the device 100 is responsive to frequency and phase changes and disturbances. Based on a change to the FCW signal 121 as input to the device 100, the controller 120, by way of the frequency loop filter 101, tunes to a new frequency by the frequency loop filter 101 adjusting the first signal 35 provided to the DCO 110. The reference frequency signal may be changed by a divider setting of a reference clock—where the divider is not illustrated in the device 100 in FIG. 1—or by way of the FCW—both changes performed via a control interface by a user of the system or by a software which detects that a load of a DSP changes or that power dissipation of the DSP heats up the associated integrated circuit (IC) excessively and that it is necessary to adapt the clock frequency of the DSP. Based on a frequency loop from the DCO 110 providing feedback in the form of the FBW signal 122, the controller 120 switches between modes by a respective control signal. The controller 120 also locks onto and remains locked to the phase by way of the phase loop filter 102 providing the second signal 36 to the DCO 110. Based on the DCO 110 providing feedback to the phase loop filter 102 by way of the first adder 140, the controller 120 stays in lock mode for any particular FCW 121 signal. The device 100 thereby provides two-stage or two-mode operation to provide frequency locking and phase locking to a device. Frequency locking behavior is adjusted by tuning the behavior of the frequency loop filter 101 and the operation of the controller 120. For example, the frequency loop filter 101 is provided with one or more of proportional, integral, and derivative (PID) control therein. Phase locking behavior is adjusted by tuning the behavior of the phase loop filter 102 and operation of the controller 120. For example, the phase loop filter 102 is provided with one or more of P, I, and D control therein.

Figure 2:
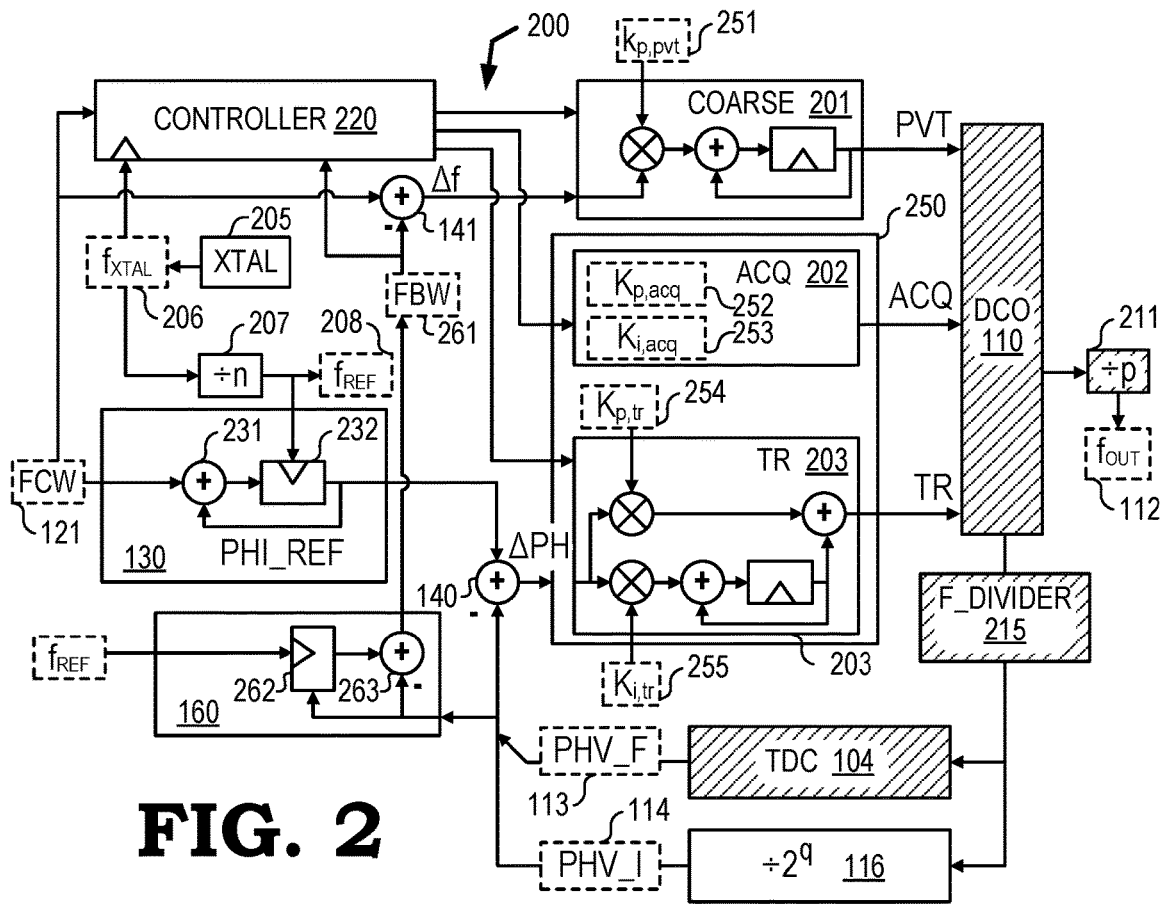
FIG. 2 is a block diagram of a device having an ADPLL and an FLL illustrating additional components in accordance with some embodiments.

FIG. 2 is a block diagram of another device 200 similar to device 100 and illustrating additional components in accordance with some embodiments. The device 200 embodies an ADPLL and includes a DCO 110, a controller 220, a reference phase generator 130 labeled PHI_REF, a feedback word generator 160, a coarse filter 201 labeled COARSE, and a phase loop filter 250. These devices are described in further detail below. The device 200 also includes a variety of other components including: an output divider 211 labeled ÷p, a divider 116 labeled $\div 2^q$, a TDC 104, and adders 140, 141. Certain components in the device

200 are analog and are illustrated with shading. Other components in the device 200 are digital and are illustrated without shading.

The controller 220 provides respective control signals to the coarse filter 201 and the phase loop filter 250. By way of example, the coarse filter 201 can take the form of a PVT filter that provides a mechanism to adjust the output signal of the ADPLL in the device 200 to accommodate variations in each of process (P), voltage (V), and temperature (T). The coarse filter 201 acts as a frequency tuner in the device 200.

The phase loop filter 250 includes two filters: an acquisition filter 202 labeled ACQ and a tracking filter 203 labeled TR. The filters 202, 203 provide phase locking for the ADPLL of the device 200. Each of these filters 202, 203 is tuned or configured differently compared to the other as further described herein and these filters 202, 203 serve different purposes in relation to phase locking. In particular, the acquisition filter 202 is tuned for a broader frequency range and thereby settles faster than the more finely tuned tracking filter 203. Operation of the acquisition filter 202 and the operation of the tracking filter 203 are based on the phase difference.

Each of these filters 202, 203 is provided a respective control signal from the controller 220. As illustrated, the tracking filter 203 includes certain components to provide control to the device 200. For example, as illustrated, the tracking filter 203 includes proportional integral (PI) control for phase locking to the DCO 110 in the form of a signal labeled TR as understood by those in the art. For example, the tracking filter 203 includes adders, multipliers, a register, and an integrator loop to provide the PI control. The acquisition filter 202 includes its own set of adders, multipliers, registers, and an integrator (not illustrated) to provide its own PI control. Proportional control of the acquisition filter 202 is provided consistent with a proportional gain 252 labeled $K_{p,acq}$. Integral control of the acquisition filter 202 is provided consistent with an integral gain 253 labeled $K_{i,acq}$ as understood by those in the art. The tracking filter 203 includes its own set of components for PI control including adders, multipliers, a register, an integrator loop, and so forth. Proportional control of the tracking filter 203 is provided consistent with a proportional gain 254 labeled $K_{p,tr}$. Integral control of the tracking filter 203 is provided consistent with an integral gain 255 labeled $K_{i,tr}$. The acquisition filter 202 provides an acquisition signal to one or more other components. The tracking filter 203 provides a tracking signal to one or more other components.

The coarse filter 201 provides a first signal labeled PVT to the DCO 110. The ACQ filter 202 provides a second signal labeled ACQ to the DCO 110. The TR filter 203 provides a third signal labeled ACQ to the DCO 110. Based on the signals, and subsequent to the output divider 211, the DCO 110 generates an output signal 112 having an output frequency labeled $f_{OUT}$. The DCO 110 also provides a signal to the frequency divider 215. In turn, the frequency divider 215 provides a signal to the TDC 104 and the divider 116. The TDC 104 receives a signal from the frequency divider 215 as input. As an example, the divider 215 divides its input signal by a factor of 8 before passing its output to subsequent components. The TDC 104 produces a TDC output 113 labeled PHV_F. The divider 116 receives its signal from the frequency divider 215 as input and produces its divider output 114 labeled as PHV_I.

The TDC 104 and the divider 116 provide their respective output signals 33, 34 to the reference phase generator 140 and the feedback word generator 160. The TDC 104 is used to increase phase resolution. Without the TDC 104, the phase resolution would be defined by the divider 116 which is clocked by the oscillator or the frequency divider 215. The resolution of the frequency divider 215 is defined by the input clock period of this divider. The TDC 104 increases the resolution to higher values. Depending on the TDC type, for example, this resolution can be half the period of the DCO 110 or a small fraction of the period. In at least some embodiments, the resolution of the phase loop determines the performance of the ADPLL in the device 200.

A crystal 205 provides an output signal 206 with a stable frequency (e.g., 10 MHz, 60 MHz) labeled as $f_{XTAL}$, which is used to clock components of the device 200 such as the reference phase generator 130, the feedback word generator 160, and the phase loop filter 250, by way of the input divider 207 as illustrated by the reference frequency signal 208.

The combination of the signals from the TDC 104 and the divider 116 serves as an input to a first adder referred to as a phase adder 140. The phase adder 140 sums a signal from the reference phase generator 130 and produces a phase difference signal labeled ΔPH which serves as an input to the phase loop filter 250. The combination of the signals from the TDC 104 and the divider 116 also are provided as input to the feedback word generator 160. Based on the reference frequency signal 208 and the input from the DCO 110, the feedback word generator 160 produces a feedback word signal 261 which is provided to the controller 220 and a second adder 141. In the device 200, a frequency control word (FCW) signal 121 is provided to the controller 220, the reference phase generator 130, and the second adder 141. The second adder 141 combines the FBW signal 122 and the FCW signal 121 to produce a frequency difference signal labeled Δf, and this difference serves as an input to the coarse filter 201.

In operation, the device 200 is responsive to frequency and phase changes and disturbances. Based on a change to the FCW signal 121, the controller 220, by way of the coarse filter 201, tunes to a new frequency by adjusting the PVT signal provided to the DCO 110. Based on a frequency loop from the DCO 110 providing feedback in the form of the FBW signal 261, the ADPLL locks onto a new frequency. The controller 220 observes the frequency difference and controls the respective loop that includes the phase loop filter 250 providing the ACQ signal and the TR signal to the DCO 110. Based on a phase loop from the DCO 110 providing feedback to the phase loop filter 250 by way of the first adder 140, the controller 220 locks onto and remains locked to a desired phase for any particular FCW 121 signal. The device 200 thereby provides a three-stage or a three-mode operation to provide frequency locking and phase locking. That is, each of the coarse filter 201, the ACQ filter 202, and the TR filter 203 is operative sequentially—one mode after the other in turn—to adjust to a set of changed conditions in the device 200. For example, first, frequency locking behavior is adjusted by tuning the behavior of the coarse filter 201 enabled by the controller 220.

While three filters 201-203 and three modes are illustrated in the device 200, any number of filters can be implemented. Preferably, a last mode is a phase tracking PLL-based mode. By way of example, the ACQ filter 202 could include various components and could be configured to operate in a first ACQ mode that is a FLL/frequency mode and then to operate in a second or PLL/phase mode that is coarser than a phase locking of the TR filter 203. In this example, the TR filter 203 would only provide phase locking.

The coarse filter 201 is provided with one or more of proportional, integral, and derivative (PID) control therein such as by way of, in part, a proportional controller having a proportional gain 251 labeled $K_{p,pvt}$. Second, phase locking behavior is adjusted by tuning the behavior of the ACQ filter 202 enabled by the controller 220. The ACQ filter 202 is provided with one or more of P, I, and D control therein. Third, phase locking behavior is adjusted by tuning the behavior of the TR filter 203 enabled by controller 220. The TR filter 203 is provided with one or more of P, I, and D control therein.

The reference phase generator 130 includes an adder 231 and a register 232 arranged to integrate an input frequency control word (FCW) signal 121. The reference phase generator 130 provides a reference phase ramp to the first adder 140. The first adder 140 provides a phase error signal to the phase loop filter 250. The FCW signal 121 may be added to the content of the register 232 each $f_{REF}$ cycle. In particular, the reference phase generator 130 generate the reference phase signal by integrating the FCW signal 121 over time.

In the device 200, in at least some embodiments, each register represents a number by any number of bits (e.g., 8 bits, 9 bits, 10 bits, 12 bits, 16 bits). In the reference phase generator 130, application of the FCW signal 121 results in the content of the register 232 increasing in a staircase shape. This value of the register 232 continues to increase until a maximum representable number, which is defined by a bit-width of the register 232, is reached. The register then will reset to an initial value (e.g., 00000000) of the register 232. After resetting, content of the register 232 is the modulo value of the sum of the register content and the FCW signal 121, divided by a maximum number defined by the bit width of the register 232 or any other set maximum number lower than the maximum count defined by the bit width of the register 232. This behavior occurs in other registers in the device 200 based upon a respective input such as FCW 121.

In the device 200, a ramp signal is applied to an adder such as the phase error adder 140. The adder 140 subtracts, from the reference phase provided by the reference phase generator 130, a feedback phase derived from one or more of a feedback frequency signal 113 and a feedback phase signal 114 provided by the TDC 104 and the phase divider 116, respectively. Thus, the feedback phase is compared to the input phase. The difference between the reference phase, provided by the reference phase generator 130, and the feedback phase is a signal for the loop of the device 200 and is provided to the phase loop filter 250 by the adder 140.

In the device 200, the components 201-203 correspond to a respective mode of operation of the device 200 including a coarse variation mode, an acquisition mode, and a tracking mode. The control inputs to the DCO 110 from the respective components 201-203 control an output signal of the DCO 110. The output signal of the DCO 110 is provided to the post divider 211, and the post divider 211 produces an output signal 112 of the device 200 having an output frequency labeled $f_{OUT}$. As examples of components, the DCO 110 includes capacitor banks in case of an LC oscillator, by one or more current digital-to-analog controllers (DACs), or by capacitor banks in case of a ring oscillator. Such components provide a means to control the frequency of the DCO 110.

In operation, each of the modes is performed in turn by the coarse filter 201, and the acquisition filter 202 and the tracking filter 203 of the phase loop filter 250, and each of the respective modes is successively narrower in frequency or phase range, respectively. A first mode is the coarse mode where a signal from the coarse filter 201 has substantial control over the DCO 110. The coarse filter 201 covers a large frequency lock range of the device 200 and a corresponding process spread. By way of example, the PVT resolution of the DCO is approximately 10 MHz/bit. At a next stage in time, a second mode is the acquisition mode where a signal from the ACQ filter 202 has substantial control over the DCO 110. In this second mode, an ACQ resolution of the DCO is, for example, on the order of 1 MHz/bit.

At a third stage in time, a third mode is the tracking mode where a signal from the tracking filter 203 has substantial control over the DCO 110. In this third mode, a tracking resolution of the DCO is, for example, approximately 20-50 kHz/bit. The proportional gain 154 ($K_{p,acq}$) and the integral gain 155 ($K_{i,acq}$) are provided to the tracking filter 203. In steady operation, once tuned to a particular frequency at a substantially constant FCW 121, the device 200 operates in tracking mode. When the device 200 starts up and when the device 200 is tuning to a new frequency, the coarse mode, the ACQ mode, and the TR mode are engaged one after the other and the device 200 is updated in each of the respective modes. These modes are controlled by the controller 220 as illustrated by the signal lines to the COARSE, ACQ, and TR components 201-203. At least some embodiments of the controller 220 include a finite state machine (FSM).

In further detail, in response to a start-up event or a change to the FCW 121, the controller 220 switches the device 200 into the coarse mode. In this first mode, a frequency control loop is activated. When the coarse frequency loop is settled after a plurality of control cycles, the controller 220 switches the device 200 into the ACQ mode. Switching is affected by an amount of the difference between the previous frequency and the new frequency. According to some embodiments, the device 200 is switched from the coarse mode to the second, ACQ mode when a frequency deviation is within a frequency control threshold of plus or minus one coarse step. When this threshold is set to a larger value, the ACQ bank as an embodiment of the acquisition filter 202 needs to be able to cover more than plus or minus one coarse step. Alternatively, a coarse time period can be defined. If this time period is exceeded, the device 200 is assumed to have settled in the coarse mode and the second ACQ phase is activated.

In the second, acquisition mode and in the third, tracking mode, the device 200 is in the frequency or the phase mode, which corresponds to operation such that a frequency or phase difference between the reference signal and the feedback signal is used for controlling an output behavior of the device 200. In some embodiments, one mode transitions to another mode (frequency to phase) by the controller 220 determining that a respective pre-defined time interval for the respective mode has been exceeded. In operation, the acquisition mode operates as part of a frequency controlled loop or a phase controlled loop. Both are feasible. The device 200 is assumed to have settled in the second, acquisition mode when the frequency difference or the phase difference is smaller than an acquisition threshold, and the device 200 transitions to the third, tracking mode at that point. Alternatively, the device 200 switches to tracking mode after a time interval when the ACQ loop can be assumed to be settled.

If the device 200 is in lock mode (acquisition mode or tracking mode), the frequency difference of the frequency loop can be used to switch back to coarse mode. This may happen when the FCW 121 changes (in this case the change can also directly be used) or if other events kick the device 200 out of lock, e.g., the change of a loop parameter or the change of the reference frequency 208. When changing the target frequency, disruptive frequency steps are avoided if the frequency update does not start at a predefined, default frequency but from the last frequency. During device startup, settling time may end up being short such as when a default is chosen (e.g., a starting point is a center of a respective tuning range). In general, to avoid overclocking in DSPs, it is beneficial to start from a lowest possible frequency.

In terms of behavior of the device 200, depending on whether a feedback frequency is too high or too low, an input to an integrator of a loop filter of the device 200 is incremented or decremented by a certain value. When the frequency difference is used to update the loop filter and to tune the DCO 110 of the device 200, the loop behaves as a first order linear loop and a lock frequency is reached following an exponential or first-order settling characteristic. In some embodiments, a higher loop order is used to further accelerate the frequency lock.

In contrast to such settling response, a conventional PLL would produce an overshoot or undershoot of frequency unless the conventional device features a very large damping factor. The conventional PLL cannot detect a frequency difference but only a phase difference between clock edges of a reference signal and the feedback signal. For example, the DCO frequency might be too low but its clock edge relevant for the comparison might appear before the reference clock edge causing the PLL to further slowdown the DCO for some time until the order of clock edges at the comparison has reversed. This effect can lead to the phenomenon that the DCO frequency might be influenced (increased or decreased) the wrong way with respect to the frequency target during the locking process which creates undesirable frequency overshoots and undershoots. This effect is overcome by the embodiments described herein.

Embodiments of ADPLLs such as the ADPLL in the device 200 can be used for frequency scaling where an operating frequency is changed dynamically. This is beneficial in cases where the clock frequency of a digital signal processor (DSP) can be adjusted according to a cycle timing budget, its actual work load, or a need to dynamically save power. In these cases, when it is possible to avoid too high frequencies or frequency glitches, the DSP can operate continuously without the need for a reset or a hold of operation when adjusting the clock frequency. Extra components, such as a frequency counter, are not necessary for the implementation of the FLL of the device 200. Embodiments of ADPLLs such as the ADPLL of the device 200 also make use of elements and information in a device that generally are already available such as feedback phase information (e.g., FBW) and the frequency control word (FCW). A differentiated feedback phase provides an oscillator frequency when this phase or differentiated phase is scaled correctly, and this differentiated phase, in the form of a feedback word (FBW), may be directly compared with the FCW as performed in the device 200. Switching to a next state of a lock process is established when a frequency difference is smaller than a threshold for a certain interval of time. If this threshold or another threshold is exceeded while assuming the ADPLL of the device 200 is in lock, this condition can be taken as an indication that the ADPLL of the device 200 is, in fact, out of lock because, the FCW 121 or reference frequency 208 has changed and the ADPLL of the device 200 needs to tune to a new frequency. Generally, in certain embodiments, frequency slope for the ADPLL of the device 200 is controlled by loop gain. A shape of ADPLL behavior is controlled by a chosen control method and one or more chosen parameters. False locks are reduced or eliminated since an incorrect frequency is detected during operation of the ADPLL of the device 200, and, during frequency lock, the output frequency of the output signal 112 settles in a deterministic manner.

Figure 3:
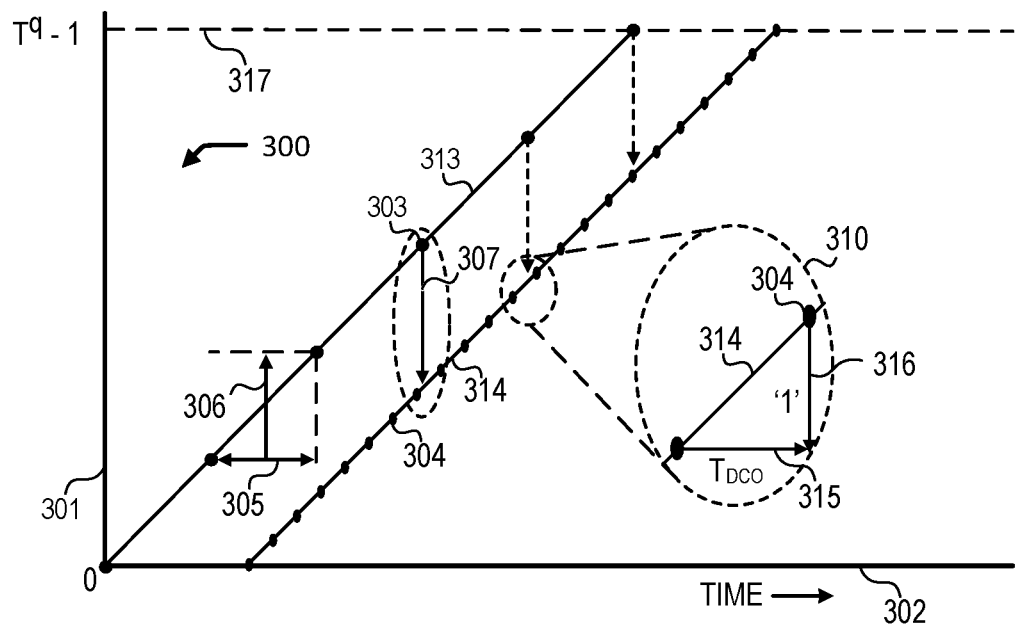
FIG. 3 is a graph of phase sampling in a phase lock mode of a device having an ADPLL and an FLL in accordance with some embodiments.

FIG. 3 is a graph 300 of phase sampling in a phase lock mode of an ADPLL with an FLL such as those in the devices 100, 200 in accordance with some embodiments. In the graph 300, a phase word 301 is measured versus time 302. A first set of points 303 generally along a first line 313 is a phase word from a reference accumulator or register such as the register 232 of the reference phase generator 130. A second set of points 304 generally along a second line 314 is a feedback phase word generated by a counter and a time-to-digital converter (TDC) such as the TDC 104. The slope of points 304 represent values consistent with the FBW 122 or FBW 261 of the ADPLLs of the devices 100, 200. A time between successive reference phase words 303 is a reference time ($T_{REF}$) 305. A distance between successive phase words 301 (graphed points) is an FCW 306 corresponding to an FCW like the FCW 121 in the devices 100, 200. A maximum 317 in the graph 300 is consistent with a size of a register such as the divider 116 where the value is based on a $2^q-1$ number of bits.

In a system including the device 100 or the device 200, the reference phase word 303 is compared with the feedback phase word 304. Because the feedback phase word 304 is generated by the counter and the TDC, the feedback phase word 304 may be available at a higher resolution than the reference clock because the clock interval of the DCO itself translates into a greater number of points along the second line 314 for the feedback phase word 304 as compared to a number of points for the reference phase word 303 in the graph 300. If the PLL is in phase-lock, as shown in the graph 300, the number of points of the second set of points 304 are FCW times larger compared to the number of points of the first set of points 303. In addition, a distance between two points on the reference curve 303 is FCW times larger than a distance between two points on the feedback curve 304. An additional factor can be achieved if multiple DCO phases are used, e.g., a factor of 2 if a rising and a falling edge of the DCO are used within the TDC. Measurement of the phase difference is only done with a reference frequency which results in the phase difference 307 with reference period TREE 305.

Figure 4:
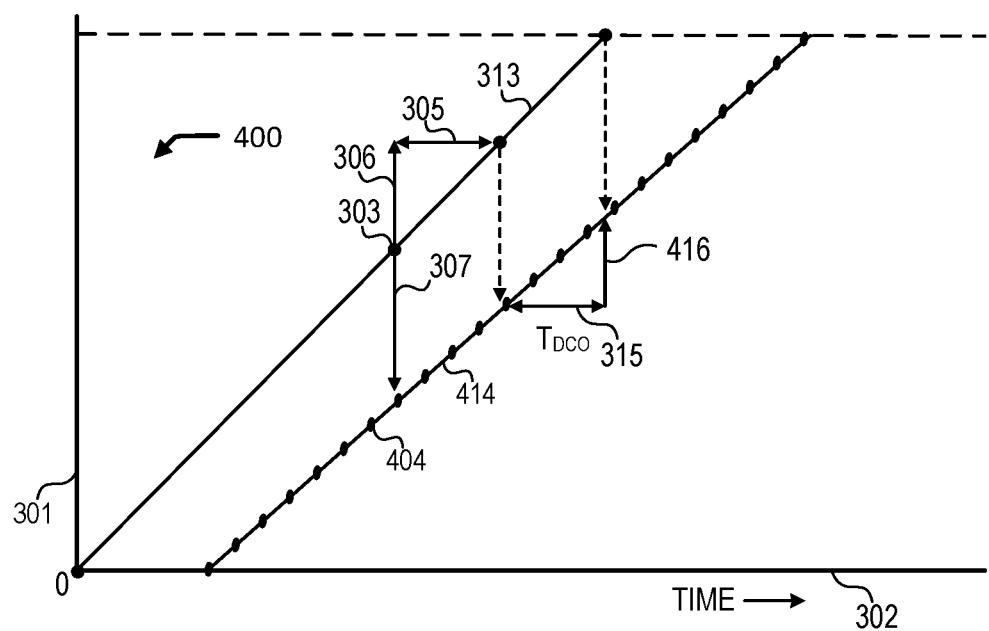
FIG. 4 is a graph of phase sampling outside of a phase lock mode in a device having an ADPLL and an FLL in accordance with some embodiments.

Further, when a system is in lock, a steepness of the reference phase word line 313 and the steepness of the feedback phase line 314 are substantially equal as illustrated in the graph 300. When equal, a frequency of an input signal and a feedback signal are substantially the same and is referred to as the frequency lock condition. In the device 200, the phase lock mode includes the ACQ and TR modes. In these modes, the reference phase word 303 is compared with the feedback phase word 304. If the system is not in lock and the frequencies differ, the steepnesses (slopes) of the lines 303, 304 differ as illustrated in FIG. 4. In phase lock, the slope of the line for the reference phase word 303 and the slope of the line for the feedback phase word 304 are identical (substantially equal) and the distance between these lines is constant and can be zero depending on the ADPLL implementation. The distance between the reference phase word 303 and the feedback phase word 304 is the phase difference.

In the graph 300, when the phase reference signal is differentiated, a result is $FCW/T_{ref}$ corresponding to a value of the difference between successive phase words 306 divided by the amount of time 305. If the feedback phase is differentiated, a result is $FBW/T_{ref}$. The FBW 261 is based on a number of DCO periods within one reference period.

That is, as illustrated, one DCO period 315 is indicated between successive second points 304 on the line 314 as indicated in close-up 310. A vertical distance 316 between successive points 304 can be defined as unity (labeled '1'). A FBW 307 is determined from values of phase word points 301 separated by a number of $T_{DCO}$ periods 315 that equal one reference period $T_{REF}$ 305: FBW is a ratio between the vertical distance 316 and $T_{DCO}$ period 315 Once FBW is known, the oscillator frequency of the DCO 110 is thereby equal to (FBW)·($f_{REF}$). From the graph 300, FBW=FCW when the device 100, 200 is in frequency lock. From the graph 300, a frequency difference Δf as provided at the second adder 141 is (FCW−FBW)·$f_{REF}$ 108. Thus, the value of FCW−FBW can be used to control the frequency control loop in the device 100, 200. Frequency lock and phase lock are evidenced in the graph 300: frequency lock is achieved when the slopes of lines 313, 314 are equal. Phase lock is achieved when a difference between graphs of lines 313, 314 is constant or even zero in particular cases.

In operation, the frequency difference Δf is scaled by a constant $K_{p,pvt}$ to update a coarse integrator of an FLL. For a first order loop, this results in an exponential settling behavior as explained in reference to FIG. 6. When calculating a difference over several reference edges, averaging of the values of FBW 307 and FCW 306 removes noise effects or and other disturbances. In embodiments of the devices 100, 200, at every reference clock edge, the content of the integrator is increased by FCW 306 and the FCW 306 is assumed to be constant. This results in a ramp signal as illustrated in the graph 300.

FIG. 4 is a graph 400 of phase sampling outside of a phase lock mode in a device such as the devices 100, 200 where the device is not in phase lock. In the graph 400, a phase word 301 is measured versus time 302. A first set of points 303 along the first line 313 is a phase word from the reference accumulator or register, the same as in the graph 300. A second set of points 404 along a second line 414 is a set of feedback phase words generated by a counter and a time-to-digital converter (TDC) and the slope of points 404 represent values consistent with the FBW 122 or FBW 261 of the devices 100, 200. The time between successive reference phase words 303 is still the reference time ($T_{REF}$) 305. The vertical distance between successive phase words 301 is the FCW 306.

In the graph 400, the second line 414 is not parallel to the first line 313. A reference frequency in the form of a FCW does not match a feedback frequency in the form of a FBW. In particular, this is evident in the value difference 416 over one DCO period ($T_{DCO}$) 315 for the feedback words of the devices 100, 200 not being substantially the same as the value for the FCW 306. Thus, a system in this state is not in the frequency lock condition, and the devices 100, 200 would be operating in the coarse mode. In the devices 100, 200, the oscillator frequency is equal to FBW·$f_{REF}$, and the frequency difference Δf is equal to (FCW−FBW)·$f_{REF}$.

Figure 5:
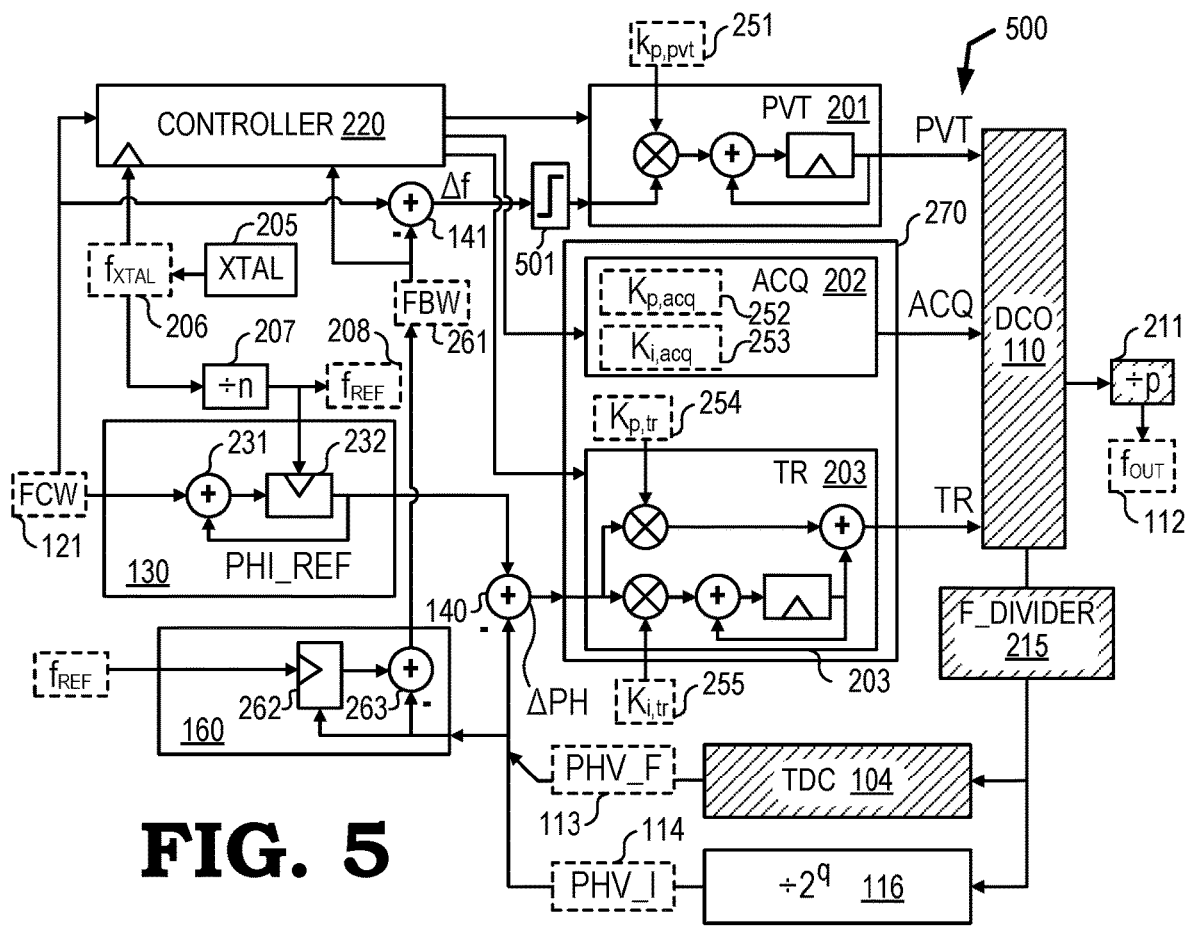
FIG. 5 is a block diagram of a device having an ADPLL and an FLL in accordance with additional embodiments.

FIG. 5 is a block diagram of an device 500 with an FLL in accordance with additional embodiments. The device 500 is similar to the device 200 and includes many of the same components of the device 200. The device 500 includes: a DCO 110, a controller 220, a reference phase generator 130, a feedback word generator 160, a coarse filter 201, and a phase loop filter 250, a divider 116, a TDC 104, and adders 140, 141. These components are described in reference to the device 200. The phase loop filter 250 includes an acquisition filter 202 and a tracking filter 203. The device 500 also includes a quantizer 501 between the second adder 141 and the coarse filter 201. The quantizer 501 provides a quantized output such as to the DCO 110. The coarse filter 201 acts as a frequency loop filter. Based on operation of the quantizer 501 providing an input to the coarse filter 201, the output frequency of the DCO 110 changes by a same amount from one clock cycle to the next clock cycle, which results in a linear frequency output ramp from the DCO 110. The quantizer 501 provides a +1 value in a case where a frequency difference is zero or positive. In an alternative implementation, the quantizer provides a zero when the frequency difference Δf is zero. The quantizer 501 provides a −1 value to the coarse filter 201 when the frequency difference Δf is negative.

Figure 6:
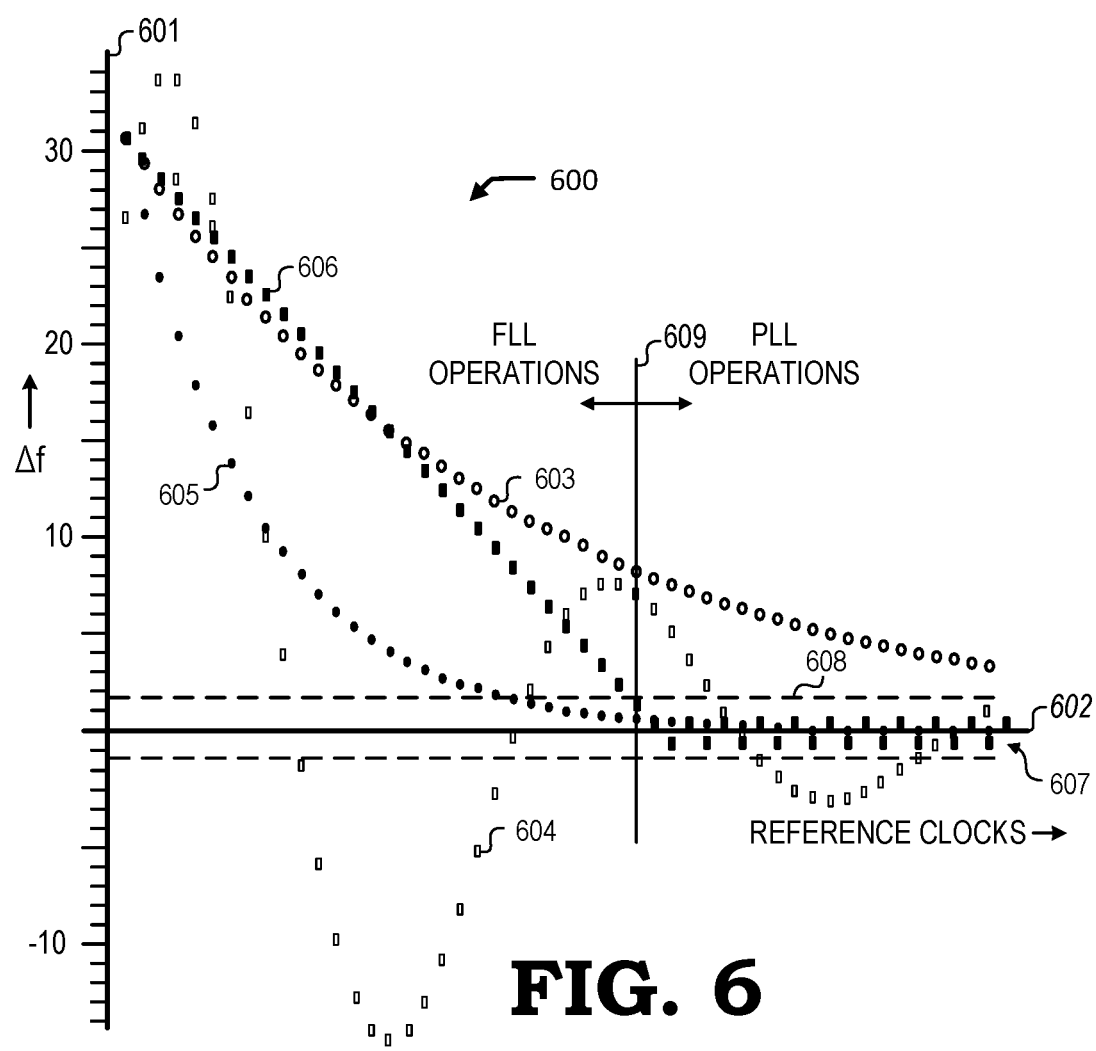
FIG. 6 is a graph of frequency sampling in a device having an ADPLL and an FLL in accordance with some embodiments.

FIG. 6 is a graph 600 of frequency sampling in a device having an ADPLL and an FLL in accordance with some embodiments. The graph 600 illustrates behavior of the devices 100, 200, 500 when in a frequency adjustment mode such as a coarse mode and thereby adapting to a new frequency by way of a change to the frequency control word 121. In the graph 600, a frequency difference 601 labeled Δf is plotted versus reference clock increments 602 after a change to a target frequency for the device 100, 200, 500. For comparison, a frequency difference settling or converging exponentially is illustrated by a first set of points 603 and by a second set of points 604 showing a damped sine-function. A conventional first order ADPLL may settle exponentially but only when the frequency is within a modulation range of the system. In conventional ADPLL systems, there is always the risk of frequency overshoot as illustrated by points 604. If loop bandwidth is too small, the loop locks to a new frequency only within a smaller frequency range as compared to the embodiments of devices 100, 200, 500 described herein. Conventional devices with higher order loops can pull the system to the right frequency. However, in these conventional devices, the oscillator is pulled and modulated excessively which may cause an overshoot. Further, depending on a particular frequency offset, adjustments and an output can take a relatively long time to reach the desired settled point such as within convergence thresholds 608. In some conventional system implementations, wide frequency ranges also generally run the risk of encountering a meta stable state in which no tuning happens. Furthermore, there is the risk that leakage or another effect compensating for a frequency change in the system and thereby the leakage cancels a small tuning signal. Additionally, there is the potential risk that a phase error pattern repeats and that no tuning happens to guide the system to a new phase or a new frequency.

In this illustrated example, a difference between a target frequency in the form of a FCW and a feedback frequency in the form of a FBW takes over 50 reference clocks 602 to reduce within the convergence thresholds 608 for a conventional device as illustrated by the first set of points 603. For a second set of points 604 the threshold may be passed several times which may result in wrong lock information since the signal is not settled so far. In contrast, a device having an ADPLL, a quantizer, and an FLL, such as the device 500, settles in under 30 reference clocks as plotted by a second set of points 606. The device 500 settles in linear fashion, and faster than a conventional device having an ADPLL that does not employ an FLL. A device having an ADPLL and an FLL—such as the devices 100, 200—settles in approximately 20 reference clocks as plotted by a third set of points 605. In at least some embodiments, an ADPLL having an FLL converges to a new frequency according to a first-order decay or settling behavior.

Frequency locking operations end after a certain dynamically-determined locking time 609 and phase locking operations begin after that time 609. For example, FLL operations of the FLL in the device 200 are applied until a new frequency in the form of a new FCW 121 reaches or exceeds the convergency thresholds 608. After the locking time 609, an acquisition mode is operative in the device 200 and active control passes to the acquisition filter 202 which begins phase locking operations in the device 200.

In the graph 600, the second set of points 606 includes a ringing behavior in the ringing 607 around the value of zero. The ringing 607 happens because an ideal frequency cannot be met just by coarse settings and use of a coarse filter such as the coarse filter 201 alone. Application of an acquisition mode and a tracking mode through the acquisition filter 202 and the tracking filter 203 removes this frequency ringing 607. Therefore, at least the acquisition filter 202 needs to be able to cover at least plus-or-minus one coarse step. A similar ringing issue may happen in a linear settling mode. In certain embodiments, ringing around zero may happen when a desired frequency is not precisely matched. Ringing is reduced significantly when the quantizer 501 also provides a zero at the output when the measured frequency offset is zero.

In certain alternative embodiments, instead of first order settling, a binary search mechanism in the coarse filter 201 can be implemented. While a binary search may be faster than first order settling, some embodiments of the binary search can modulate the DCO 110 in an unwanted manner. Further, if a fast lock without a frequency overshoot is required in a device, the linear step approach with a quantizer, as illustrated in the second set of points 606, can be used in the devices 100, 200, 500 with an adapted loop gain and a frequency offset. Given that a DCO gain is known from a calibration action at start up or during a product test, one or more steps at a beginning of a tuning of a device can be large. As soon as the offset gets into the order of the magnitude of a frequency resolution of the DCO 110, frequency steps can be made smaller. In this fashion, the frequency filter settling can be made faster. One result of such adaptive settling would be as fast or even faster settling as compared to the binary search mechanism and would also avoid overshoots in the frequency graph 600. The loop gain of a device employing a device having an ADPLL and an FLL can be adjusted either by the step-size of the update or by the gain of the loop filter in the coarse mode.

Figure 7:
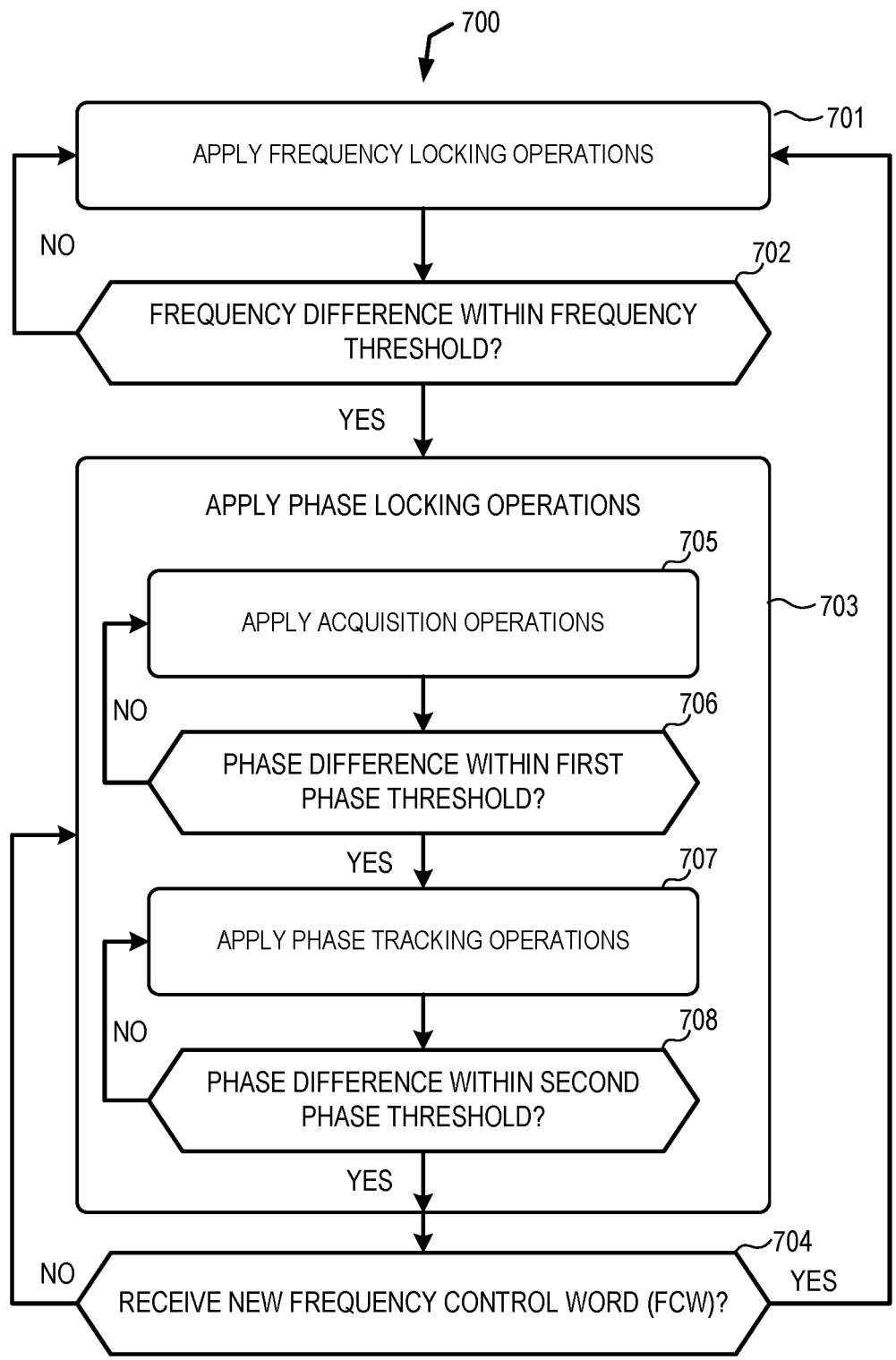
FIG. 7 is a flow diagram of a method for applying an FLL to a device having an ADPLL in accordance with some embodiments.

FIG. 7 is a flow diagram 700 of a method for applying a FLL to a device having an ADPLL in accordance with some embodiments. After a start-up or when the FCW is changed, at block 701, a device, such as one of the illustrated devices 100, 200, 500, switches to a frequency or coarse mode. This mode is a first mode of operation. In this first mode, control operations are activated and performed by the FLL based on a frequency difference. Herein, the FLL is synonymous with a frequency control loop (FCL). At block 702, a system or device employing the ADPLL and FLL determines whether a coarse loop in the coarse mode is settled by determining whether a frequency difference is within a frequency threshold. Alternatively, at block 702, a coarse time period is defined. If this coarse time period is exceeded during application of the frequency locking operations, the system is assumed to have settled in the coarse mode and another phase is activated.

If the frequency difference is within the frequency threshold, at block 703, a new mode is entered and phase locking operations are applied in the system. In a device, such as the device 200 and the device 500, the system switches to one of a plurality of phase lock modes. For example, at block 705, acquisition operations are applied. At block 706, the system determines whether a phase difference between a reference signal and a produced oscillator signal (e.g., DCO output signal) is within a first phase threshold. In some embodiments, the first phase threshold is a second threshold where a first threshold is the frequency threshold. In certain embodiments of the device 200, 500, the system is switched from the coarse mode to the acquisition mode when the frequency deviation is within a threshold of plus-or-minus one coarse step. If the frequency threshold is set to a larger value, an acquisition circuit needs to be able to cover more than the plus-or-minus one coarse step.

At block 707, when the phase difference between the reference signal and the produced oscillator signal is within the first phase threshold, phase tracking operations are applied until a further change in the system occurs or until a second phase threshold is reached or exceeded. For example, a further change includes receiving a new frequency control word (FCW) by the system at block 704. At block 708, the system determines whether the phase difference is within a second phase threshold. If not, the system continues to apply phase tracking operations.

At a relative steady state, the loop operates in the tracking mode by applying tracking operations. If there is a small update in the system, the loop may go back to the acquisition mode as needed. If there is a larger update, the system goes back to the coarse mode by applying the coarse filter 201. In a specific example, for the device 200, at block 703, the second mode of the loop of the system is in the phase mode, which means that the phase difference between the reference and feedback phases is used for controlling the loop in the system. According to at least some embodiments, the modes (coarse, acquisition, and tracking modes) are controlled by exceeding a corresponding threshold for a certain minimum time or defined time interval. According to some alternative embodiments, the acquisition mode operates as a second frequency-controlled loop instead of a first phase-controlled loop like the coarse mode. Detecting a frequency difference of the frequency loop during phase lock can be used to switch back to the coarse mode. This event happens when the FCW 121 changes or when another event kicks the system out of lock, such as a change of a loop parameter or a change to the reference frequency 208. When changing the target frequency in the system, disruptive frequency-steps are avoided when the frequency update does not start at a predefined, default frequency but from a last-in-time frequency. During start-up, a settling time is minimized in general when a default frequency is chosen, e.g., a frequency approximately in a center of the tuning range of the system.

As described above, the configurations illustrated in FIGS. 1-7 are some of a plurality of possible configurations for providing a frequency locked loop to an ADPLL in a device or a system and illustrative methods for operating the same. The techniques described herein are applicable to a variety of configurations of components and in a variety of applications. The configurations illustrated in FIGS. 1-7 provide a frequency control loop within or in cooperation with an ADPLL without the use of a special frequency counter, which is a typical component of conventional ADPLLs. The FLL is able to pull the ADPLL to any frequency that the oscillator allows without changing a loop bandwidth to an extremely large value and without creation of frequency overshoots or clock glitches. Instead, the described embodiments provide a fast and well-controlled frequency ramp. The embodiments provide a fast locking ADPLL and device that can quickly acquire a new frequency based on an FLL or frequency detector. The embodiments can be applied in many types of devices including tuner ICs and wired and wireless data transmission systems. The embodiments are ideal for deep sub-micron- and nano-scale technologies. The described devices and ADPLLs together with a frequency control loop or frequency locked loop support frequency scaling corresponding to systems that switch a system clock in a controlled manner to different frequencies according to cycle budget needs.

Systems that change in a controlled manner avoid over-clocking of their DSPs and avoid timing violations, which could require a reset to get back to a normal operation. Resets are very disadvantageous because operation is interrupted. Avoidance of timing violations in digital circuitry caused by frequency overshoots is typically prevented by over-constraining the circuitry design which leads to higher power and increased circuit area consumed by the device and its components. Use of the frequency control loop as described herein prevents over-clocking and avoids over-constraining and over-designing systems.

Generally, conventional systems and conventional ADPLLs use additional dividers for frequency measurements, calculate an oscillator frequency out of a feedback phase, and perform a binary search for searching for a new frequency. These conventional features lead to large frequency overshoots and can cause excessively large frequency glitches in DSPs. Further, some conventional ADPLLs determine phase error and perform successive approximation searches based on the DCO output frequency. Such operation leads to output frequency overshoots from the DCO. Conventional ADPLLs thereby cannot be used for frequency scaling in DSPs without tolerance for resets and interrupted operations or the need for over-constraining and adding more design margin. Some conventional ADPLLs make use of a difference between divider states to derive frequency information but do not use a TDC. In these ADPLLs, frequency information is less accurate, and increased ringing of the oscillator frequency occurs. In certain situations, dead zones and arbitrary locking can occur. For a next loop state with higher resolution, the frequency offset, that ordinarily should be trending toward settlement, can get larger and therefore take longer. While such behavior is improved by averaging values, use of averaging extends settling time which is undesirable.

Note that not all of the activities or elements described above in the general description are required, that a portion of a specific activity, component, or device may not be required, and that one or more further activities may be performed, or elements included, in addition to those described. Still further, the order in which activities are listed are not necessarily the order in which they are performed. Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims. Moreover, the particular embodiments disclosed above are illustrative only, as the disclosed subject matter may be modified and practiced in different but equivalent manners apparent to those skilled in the art having the benefit of the teachings herein. No limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

What is claimed is:

1. A hardware device comprising:
    a frequency lock loop (FLL) including a frequency loop filter;
    a quantizer coupled as an input to the frequency loop filter and configured to receive a frequency difference signal;
    a phase lock loop (PLL) including a phase loop filter; and
    a controller configured to provide a first control signal to the FLL and a second control signal to the PLL.

2. The hardware device of claim 1, wherein one or more of the PLL and the FLL further include:
    a digital controlled oscillator (DCO) configured to provide an output signal; and
    a time-to-digital converter (TDC) configured to receive an input signal from the DCO.

3. The hardware device of claim 1, wherein the PLL is an all digital PLL (ADPLL).

4. The hardware device of claim 1, wherein the frequency difference signal is based on a digital frequency control word and a feedback word from a feedback word generator.

5. The hardware device of claim 1, wherein the FLL is configured to:
    compensate, based upon a frequency difference signal, an output signal according to a first-order settling characteristic.

6. The hardware device of claim 1, further comprising:
    a process (P), a voltage (V), and a temperature (T) (PVT) filter, wherein the hardware device is configured to adjust to a variation of at least one of P, V, and T in the hardware device.

7. The hardware device of claim 1, wherein the PLL includes:
    an acquisition filter tuned to a first range, wherein the controller operates the acquisition filter based on detecting a phase difference exceeding a first phase difference threshold; and
    a tracking filter tuned to a second range narrower than the first range.

8. The hardware device of claim 1, further comprising:
    a feedback word generator coupled to an output of the TDC and a divider, wherein the feedback word generator is configured to provide an input signal as a digital feedback word to the controller.

9. A frequency and phase tuning device comprising:
    a digital controlled oscillator (DCO);
    a first filter configured to tune an output frequency of an output signal of the DCO and receive a frequency difference signal, the first filter coupled as a first input to the DCO;
    a second filter configured to tune an output phase of the DCO and receive a phase difference signal, the second filter coupled as a second input to the DCO;
    a time-to-digital converter (TDC) receiving an input from the DCO;
    a divider configured to receive an input from the DCO; and
    a controller coupled to the first and second filters and configured to provide a frequency control signal to the first filter and a phase acquisition control signal to the second filter, wherein the controller forms a frequency locked loop (FLL) with the first filter, the TDC, and the divider, and wherein the controller forms an all digital phase locked loop (ADPLL) with the second filter, the TDC, and the divider.

10. The frequency and phase tuning device of claim 9, wherein the controller is configured to:
   compare a calculated frequency to a measured frequency; and
   compensate, based upon the comparison, the first filter to decrease a settling time of the output signal of the DCO according to a first-order settling time using the frequency signal.

11. The frequency and phase tuning device of claim 9, wherein the first filter is configured to adjust for a variation in at least one of a process (P), a voltage (V), and a temperature (T) change in the device.

12. The frequency and phase tuning device of claim 9, further comprising:
   a third filter for tuning the output phase of the output signal of the DCO, wherein:
      the third filter is tuned to a narrower frequency range than the second filter;
      the third filter provides a tracking signal to the DCO; and
      the DCO produces the output signal based on the frequency signal, the phase acquisition signal, and the tracking signal.

13. The frequency and phase tuning device of claim 12, wherein the third filter includes proportional and integral control to the phase acquisition signal provided to the DCO.

14. The frequency and phase tuning device of claim 12, wherein the controller is configured to:
   operate the second filter in response to detecting a frequency difference exceeding a frequency threshold; and
   operate the third filter in response to detecting a phase difference exceeding a phase threshold.

15. The frequency and phase tuning device of claim 9, further comprising:
   a quantizer coupled as an input to the first filter and configured to receive the frequency difference signal.

16. The frequency and phase tuning device of claim 15, wherein the frequency difference signal is based on a digital frequency control word and a feedback word from a feedback word generator.

17. A method for providing frequency locking and phase locking operations in a hardware device, the method comprising:
   applying a frequency locking operation in a frequency locked loop (FLL) until a digital frequency difference is within a frequency threshold, the FLL including a frequency loon filter;
   coupling a quantizer as an input to the frequency loop filter, the quantizer configured to receive the frequency difference; and
   applying a first phase locking operation in an all digital phase locked loop (ADPLL) until a digital phase difference is within a first phase threshold.

18. The method of claim 17, further comprising:
   applying a second phase locking operation in the ADPLL after the digital phase difference is within the first phase threshold.

19. The method of claim 17, wherein applying the second phase locking operation includes providing proportional and integral control to an input signal.

20. A hardware device comprising:
   a frequency lock loop (FLL) including a frequency loop filter;
   a phase lock loop (PLL) including:
      a phase loop filter;
      a digital controlled oscillator (DCO) configured to provide an output signal; and
      a time-to-digital converter (TDC) configured to receive an input signal from the DCO; and
   a controller configured to provide a first control signal to the FLL and a second control signal to the PLL.

* * * * *